United States Patent [19]

Kaneko et al.

[11] Patent Number: 5,023,578

[45] Date of Patent: Jun. 11, 1991

[54] FILTER ARRAY HAVING A PLURALITY OF CAPACITANCE ELEMENTS

[75] Inventors: Toshimi Kaneko; Hidetoshi Yamamoto; Takayuki Hirotsuji, all of Nagaokakyo, Japan

[73] Assignee: Murata Manufacturing Co., Ltd., Japan

[21] Appl. No.: 481,738

[22] Filed: Feb. 14, 1990

Related U.S. Application Data

[63] Continuation of Ser. No. 231,081, Aug. 11, 1988, abandoned.

[30] Foreign Application Priority Data

Aug. 11, 1987 [JP] Japan ............................... 62-123235
Dec. 21, 1987 [JP] Japan ............................... 62-194177
Dec. 21, 1987 [JP] Japan ............................... 62-194178

[51] Int. Cl.$^5$ .............................................. H03H 7/01
[52] U.S. Cl. ..................................... 333/185; 361/330
[58] Field of Search ............................... 333/181–185; 361/328–330; 439/607, 620

[56] References Cited

U.S. PATENT DOCUMENTS

| | | | |
|---|---|---|---|
| 4,126,840 | 11/1978 | Selvin | 333/182 X |
| 4,739,440 | 4/1988 | Fujiki et al. | 361/329 |
| 4,758,805 | 7/1988 | Yamazaki et al. | 333/185 X |
| 4,782,310 | 11/1988 | Saburi et al. | 333/185 X |

FOREIGN PATENT DOCUMENTS 169053 1/1986 European Pat. Off. ............ 333/185
188122 11/1982 Japan ................................. 333/185

OTHER PUBLICATIONS

Boutros, K. S.; "A New Approach to the Design of EMI Filter Connectors Using Planar Filters"; *12th Ann. Connector Symposium Proc.;* Cherry Hill, N.J.; Oct. 17, 18 1979; pp. 222–226.

*Primary Examiner*—Eugene R. Laroche
*Assistant Examiner*—Benny Lee
*Attorney, Agent, or Firm*—Ostrolenk, Faber, Gerb & Soffen

[57] ABSTRACT

A filter array includes a dielectric unit with a plurality of individual electrodes formed on one main surface and a common electrode on the other main surface. The individual electrodes are formed at predetermined intervals so as to extend across the dielectric unit in a direction of a width of the dielectric unit. Since each of the individual electrodes and the common electrode face each other, they form with the dielectric unit, a plurality of capacitance elements. To both ends of each of the individual electrodes, input and output terminals are respectively connected. The input and output terminals project outward from the dielectric unit. A conductive plate is joined to the common electrode, and common terminals are integrally formed on the conductive plate so as to extend outward in a direction of the width of the dielectric unit. Each of the pairs of input and output terminals are inserted and connected to respective signal lines and the common terminals are connected to ground.

21 Claims, 8 Drawing Sheets

FILTER ARRAY HAVING A PLURALITY OF CAPACITANCE ELEMENTS

This is a Continuation of application Ser. No. 07/231,081 filed on Aug. 11, 1988, now abandoned.

BACKGROUND OF THE INVENTION

1. Field of the Invention

The present invention relates to a filter array having a plurality of capacitance elements. More specifically, the present invention relates to a novel filter array having a plurality of capacitance elements, in which a plurality of 3-terminal capacitors are formed on a single dielectric unit such that the filter array can be utilized as a noise filter, for example.

2. Description of the Prior Art

One example of a conventional 3-terminal capacitor which is in the a background of the present invention and is utilized for a noise filter is shown in FIG. 1A and FIG. 1B. The conventional 3-terminal capacitor 1 as shown includes a dielectric unit 2, and electrodes 3a and 3b are formed on both main surfaces, respectively. Input and output terminals 4a1 and 4a2 are fixed to one electrode 3a, and a common terminal 4b is fixed to the other electrode 3b. Therefore, as shown in FIG. 1B, a capacitance C is formed between the input and output terminals 4a1 and 4a2 and the common terminal 4b. The input and output terminals 4a1 and 4a2 are inserted and connected to a signal line and the common terminal 4b is connected to ground.

Since the 3-terminal capacitor 1 has a self-resonance frequency higher than that of a conventional 2-terminal capacitor, the 3-terminal capacitor 1 can effectively exhibit a noise eliminating effect up to high-frequency region.

Another example of the conventional 3-terminal capacitor is shown in FIG. 2A and FIG. 2B. The 3-terminal capacitor 1 shown has a similar configuration to that of the 3-terminal capacitor as shown in FIG. 1A and FIG. 1B, but bead cores 5 are put on the input and output terminals 4a1 and 4a2, respectively. Therefore, in this example, as shown in FIG. 2B, in addition to the capacitance C, an inductance L is formed by means of cooperation of the input and output terminals 4a1 and 4a2 and bead cores 5, whereby a filter characteristic can be increased.

In the conventional 3-terminal capacitor 1 as shown in FIG. 1A and FIG. 1B or FIG. 2A and FIG. 2B, it is necessary to insert one 3-terminal capacitor for each signal line. Therefore, in case where such a 3-terminal capacitor is to be connected to each of a number of signal lines, a number of 3-terminal capacitors become necessary. Therefore, not only it is troublesome to mount such a number of 3-terminal capacitors on a circuit board but also the number of processing steps and a cost thereof increase.

SUMMARY OF THE INVENTION

Therefore, a principal object of the present invention is to provide a novel filter array having a plurality of capacitance elements.

Another object of the present invention is to provide a filter array in which a plurality of 3-terminal capacitors are formed on a single unit.

A further object of the present invention is to provide a filter array having a plurality of capacitance elements capable of being surface-mounted onto a circuit board.

A filter array having a plurality of capacitance elements in accordance with the present invention comprises a dielectric unit, a plurality of individual electrodes formed on one main surface of the dielectric unit, a common electrode formed on the other main surface of the dielectric unit so as to face the plurality of individual electrodes, a plurality of pairs of input and output terminals connected to respective individual electrodes, and a common terminal connected to the common electrode.

Since respective individual electrodes are opposite to the common electrode through the dielectric unit, a capacitance is formed between each of the respective individual electrodes and the common electrode. Since such a capacitance is connected to each pair of the input and output terminals and the common terminal, a plurality of 3-terminal capacitors can be formed on the dielectric unit. When the pairs of the input and output terminals are inserted and connected to respective signal lines and the common terminal is connected to ground, for example, each of the respective capacitances and thus each of the 3-terminal capacitors functions as a noise filter with respect to each corresponding signal line.

In accordance with the present invention, since a plurality of 3-terminal capacitors are formed on a single unit, in a case where a noise filter is constructed by connecting each 3-terminal capacitor to a respective one of a number of signal lines, it is possible to reduce the number of parts and components and thus the number of the processing steps, whereby the cost thereof can be decreased, in comparison with the use of conventional 3-terminal capacitors.

In one preferred embodiment, respective individual electrodes are formed so as to extend across the dielectric unit in parallel with each other. Therefore, in accordance with this embodiment, by making the intervals between respective input and output terminals small, it is possible to perform highdensity mounting. In addition, if the input and output terminals and the common terminal extend from the filter array in a direction parallel with a main surface of the dielectric unit, it is possible to surface-mount such an array onto the circuit board.

In another preferred embodiment, respective individual electrodes are formed in a zigzag or snaked fashion. Therefore, inductances are formed between respective pairs of the input and output terminals by the respective individual electrodes. In accordance with this embodiment, a filter characteristic can be increased by cooperation of the capacitances and the inductances.

In addition, in order to form such inductances magnetic bodies may be disposed in the vicinity of the respective individual electrodes.

These objects and other objects, features, aspects and advantages of the present invention will become more apparent from the following detailed description of the embodiments of the present invention when taken in conjunction with accompanying drawings.

BRIEF DESCRIPTION OF THE DRAWINGS

FIG. 1A is a perspective view thereof and FIG. 1B is an equivalent circuit diagram thereof.

FIG. 2A is a front view thereof and FIG. 2B is an equivalent circuit diagram.

FIG. 3A is a perspective view when viewed from an upper surface and FIG. 3B is a fragmentary perspective view when viewed from a lower surface.

FIG. 10A is a perspective view and FIG. 10B is a fragmentary perspective view.

FIG. 11A is a perspective view and FIG. 11B is a fragmentary perspective view.

DETAIL DESCRIPTION OF THE PREFERRED EMBODIMENTS

Figure 1A:
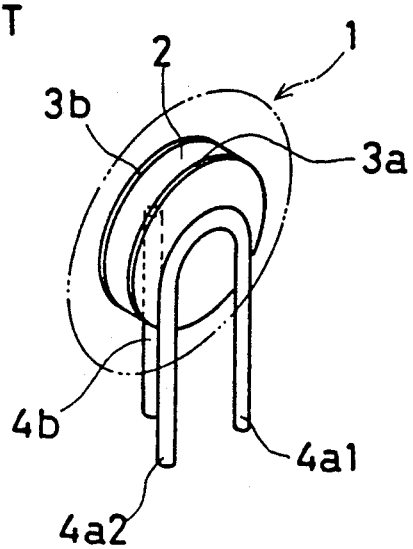
FIG. 1A and FIG. 1B are illustrative views showing one example of a conventional 3-terminal capacitor.
Figure 1B:
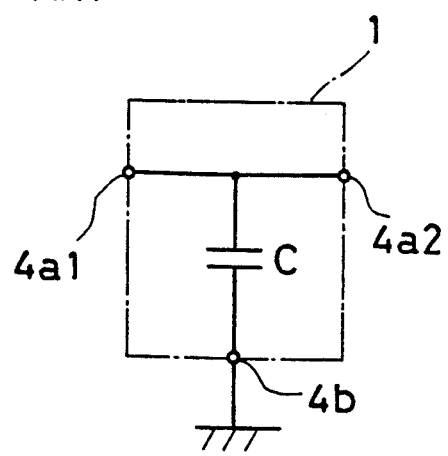
Figure 2A:
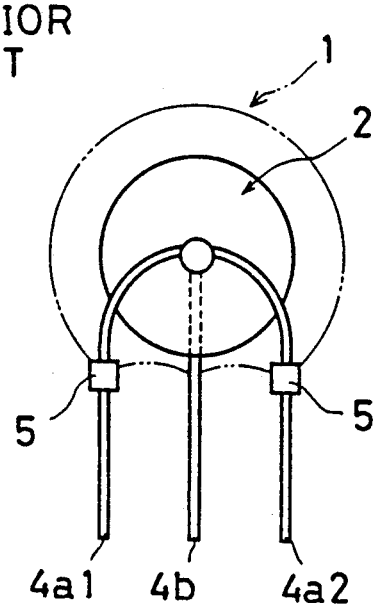
FIG. 2A and FIG. 2B are illustrative views showing another example of a conventional 3-terminal capacitor.
Figure 2B:
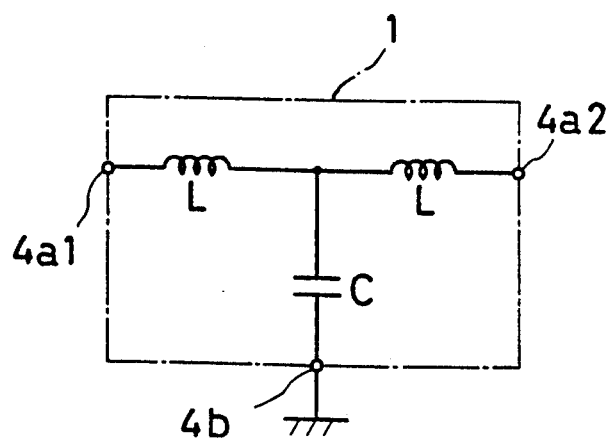
Figure 3A:
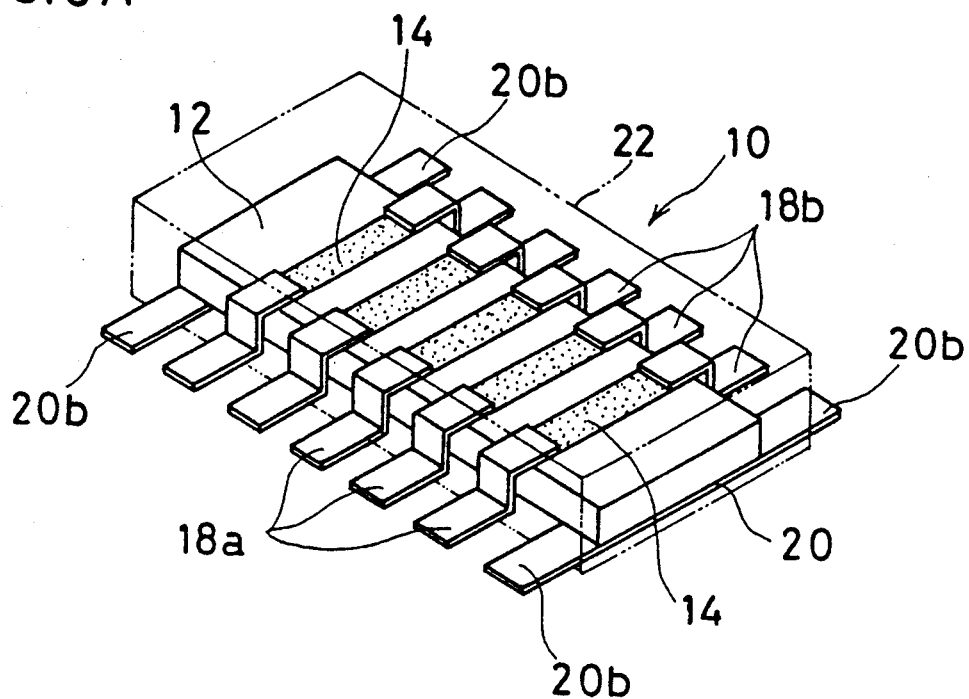
FIG. 3A and FIG. 3B are illustrative views showing one embodiment in accordance with the present invention.
Figure 3B:
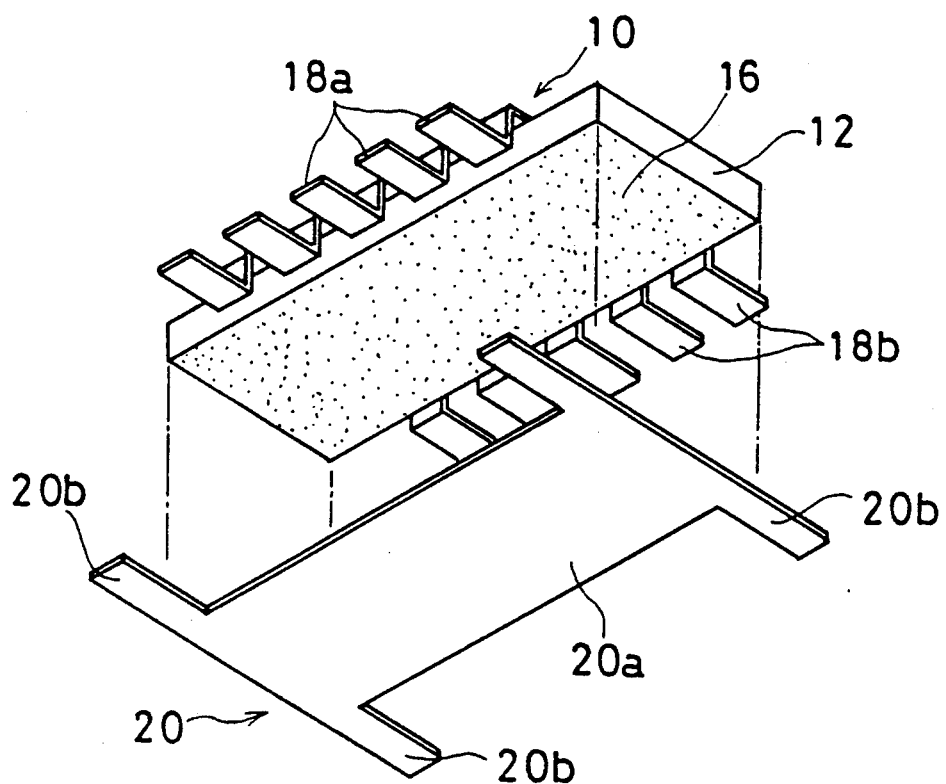

With reference to FIG. 3A and FIG. 3B, a filter array having a plurality of capacitance elements (hereinafter, simply called a "filter array") 10 of one embodiment in accordance with the present invention includes a rectangular dielectric unit 12 made of dielectric material such as ceramics. On one main surface (the upper surface) of the dielectric unit 12, a plurality of individual electrodes 14 are formed by applying and firing an electrical conductive paste such as a silver paste. Each of the individual electrodes 14 is formed such that it extends from one end to the other end of the dielectric unit 12 in a direction of a width of the dielectric unit 12 so as to cross the dielectric unit 12 in a direction of the width thereof. Respective individual electrodes 14 are formed at predetermined intervals and in parallel with each other. In addition, on the other main surface (the lower surface) of the dielectric unit 12, a common electrode 16 (see FIG. 3B) is formed by applying and firing the above described electrically conductive paste so as to spread over the whole surface, approximately.

A plurality of input and output terminals 18a and 18b are fixed to the dielectric unit 12 at the both ends in a direction of the width thereof. One end of each of the input and output terminals 18a and 18b is connected to an end of a corresponding individual electrode 14 by soldering the both on one main surface of the dielectric unit 12. Each of the input and output terminals is folded or bent such that the other end thereof is extended outward in parallel with the other main surface at a height position approximately equal to the other main surface of the dielectric unit 12. Thus, the input and output terminals 18a and 18b are arranged as a DIP type in which the input and output terminals 18a and 18b are projected outward at the both side ends of the dielectric unit 12.

To the common electrode 16, a conductive plate 20 is connected with face by soldering, for example. The conductive plate 20 includes a main surface 20a (see FIG. 3B) having an area as same as that of the dielectric unit 12 and thus the common electrode 16, common terminals 20b are formed so as to be extended from four corners of the main surface 20a and projected outward in a direction of the width of the dielectric plate 12. Therefore, the common terminals 20b are extended outward in a direction parallel with the other main surface of the dielectric unit at the same position as the other main surface in the height thereof. Then, the common terminals 20b are disposed at the both side ends of the dielectric unit 12 so as to exist outside the input and output terminal 18a in a direction of a length of the dielectric unit 12.

Then, as shown by a 2-dotted line in FIG. 3A, a resin molded layer 22 is formed. The resin molded layer 22 may be substituted with an outer case which may be a resin case or a metallic case, for example. In the case where the metallic case is utilized, preferably, the common terminals 20b and the outer case 22 are electrically connected to each other.

Figure 4:
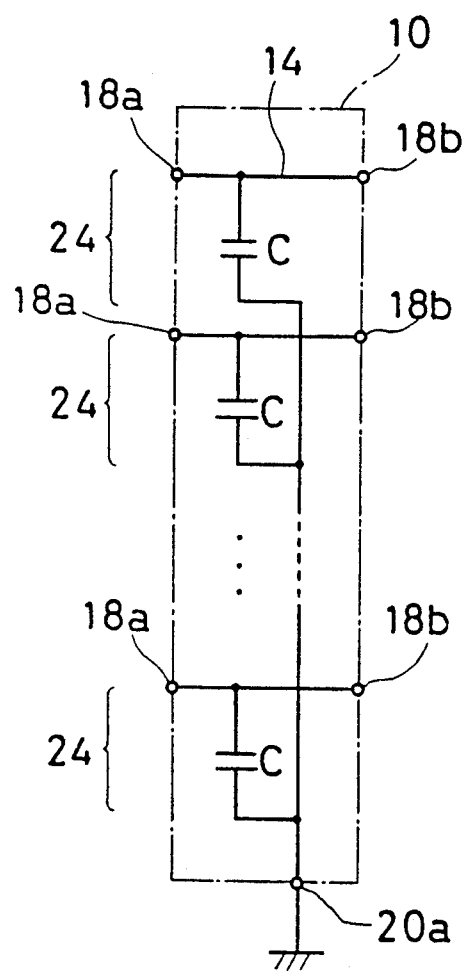
FIG. 4 is an equivalent circuit diagram of the embodiment shown in FIG. 3A and FIG. 3B.

In accordance with the embodiment as shown in FIG. 3A and FIG. 3B, the filter array 10 having an equivalent circuit as shown in FIG. 4 is obtainable. More specifically, the capacitance C is formed between each of the individual electrodes, that is, each pair of the input and output terminals 18a and 18b and the common terminal 20b, respectively. Thus, in this filter array 10, 3-terminal capacitor 24 is formed for each individual electrode 14.

Then, if the pair of the input and output terminal 18a and 18b are inserted and connected to a signal line (not shown) and the common terminal 20b is connected to the ground, as in the conventional case, respective 3-terminal capacitors 24 act as a noise filter. Therefore, it is possible to eliminate noise. That is, it is possible to eliminate spurious high-frequency components included in a signal being transmitted on the signal line into which the 3-terminal capacitor 24 is inserted.

Figure 5:
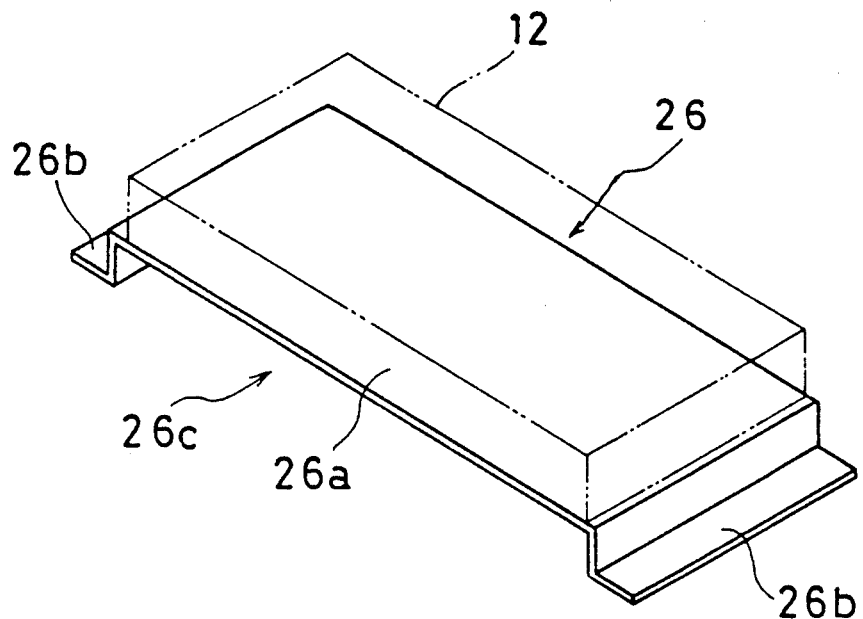
FIG. 5 is an illustrative view showing a modified example of common terminals.

FIG. 5 shows a modified example of the conductive plate which is fixed to the other main surface of the dielectric unit 12. The conductive plate 26 of this embodiment includes a bottom plate 26a having the same width and length as that of the other main surface of the dielectric unit 12, and as shown by a 2-dotted line, the dielectric unit 12 is disposed on the bottom plate 26a. Common terminals 26b are formed so as to be extended from the both ends of the conductive plate 26 in a direction of length thereof. The common terminals 26 are bent downward to form a step, thereby an air gap 26c can be formed below the dielectric unit 12, that is, the bottom plate 26a. Therefore, since an air can stream through the air gap 26c, in accordance with this embodiment, there is an advantage that a thermal radiation characteristic becomes good. This makes possible to increase a current capacity. In addition, in accordance with this embodiment, since the common terminals 26b are formed in a wide width, a residual inductance due to the common terminals is reduced in comparison with the previous embodiment in which the common terminals formed in a narrow width are utilized, thereby it is possible to further increase a filter characteristic in high-frequency region.

Figure 6:
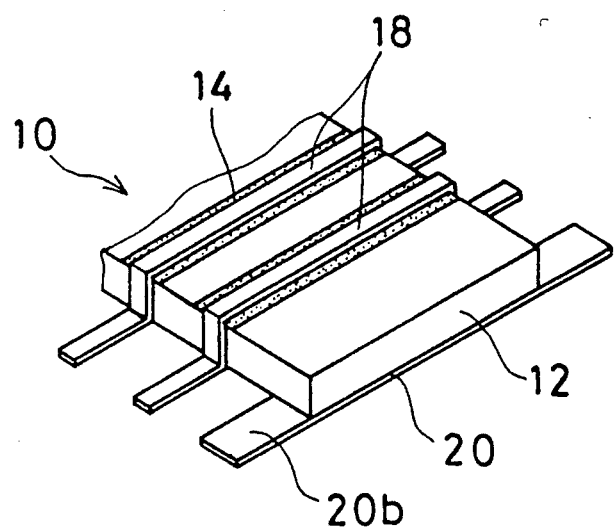
FIG. 6 is an illustrative view showing a modified example of input and output terminals.

FIG. 6 shows a modified example of the input and output terminals, in this embodiment shown, each of the input and output terminals 18 is comprised of a single conductive plate which continues over the whole length of the corresponding individual electrode 14. Each of the input and output terminals 18 is electrically connected to each of the individual electrodes 14 at a suitable position. In this embodiment shown, since each of the input and output terminals 18 is formed by a single continuous conductive plate, the input and output terminals 18 also function as signal transmission lines, and therefore, it is possible to increase a current capacity.

Figure 8:
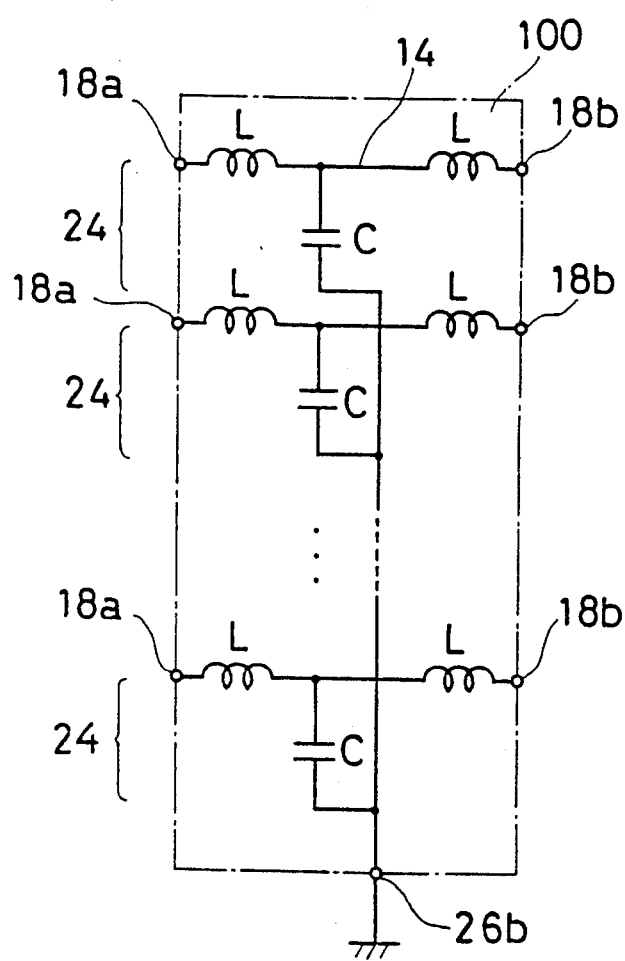
FIG. 8 is an equivalent circuit diagram of the embodiment shown in FIG. 7.
Figure 7:
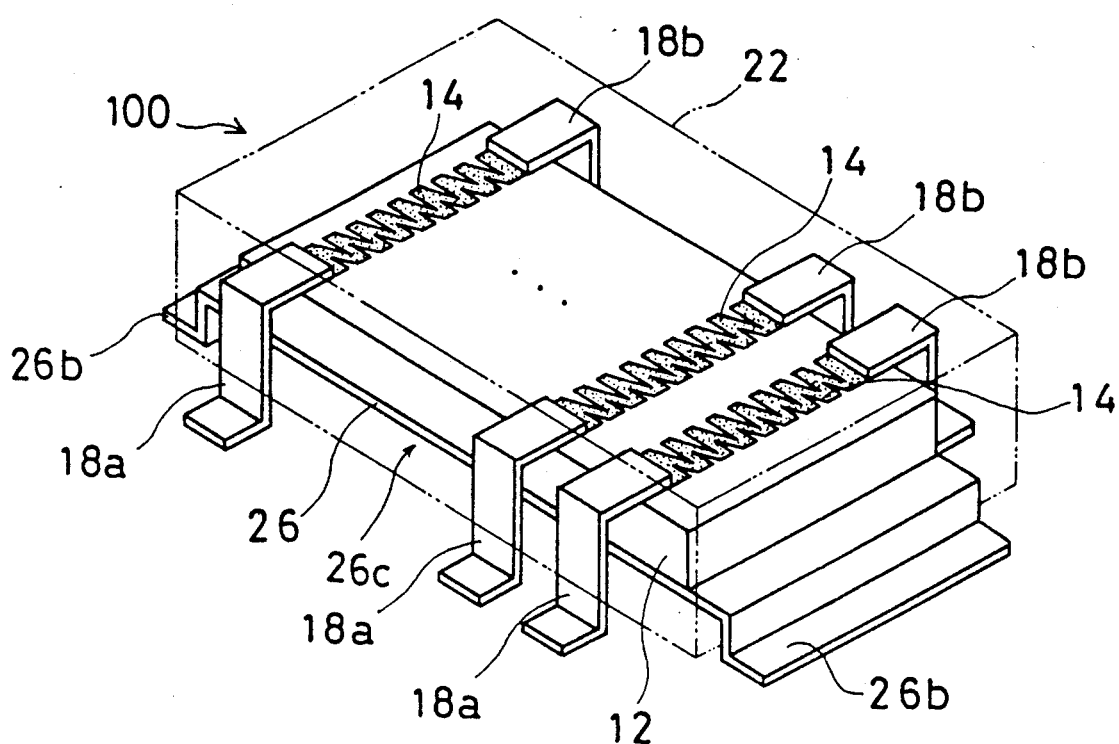
FIG. 7 is a perspective view showing another embodiment in accordance with the present invention.

With reference to FIG. 7 showing another embodiment in accordance with the present invention, a filter array 100 of this embodiment is a filter array in which inductances are added to the filter array 10 of the previous embodiment. Therefore, in this embodiment, a form or configuration of the individual electrode 14 is different from that of the previous embodiment. More specifically, in FIG. 7 embodiment, the individual electrode 14 is formed in a zigzag fashion such that the length of the individual electrode 14 becomes longer than the length of the dielectric unit 12 in a direction of the width thereof. As shown in FIG. 8, an inductance L is formed between each of the pairs of the input and output terminals 18a and 18b by such a zigzag individual electrode 14. It is possible to further increase a filter characteristic in the high frequency region by cooperation of the inductance L and the capacitance C of each of the respective 3-terminal capacitors 24.

In addition, in the FIG. 7 embodiment, the conductive plate 26 as shown in FIG. 5 is utilized to form common terminals 26b. Therefore, the input and output terminals 18a and 18b are bent such that a distance between one end and the other end in a direction of the height thereof becomes longer than that of the embodiment shown in FIG. 3A and FIG. 3B.

Figure 9:
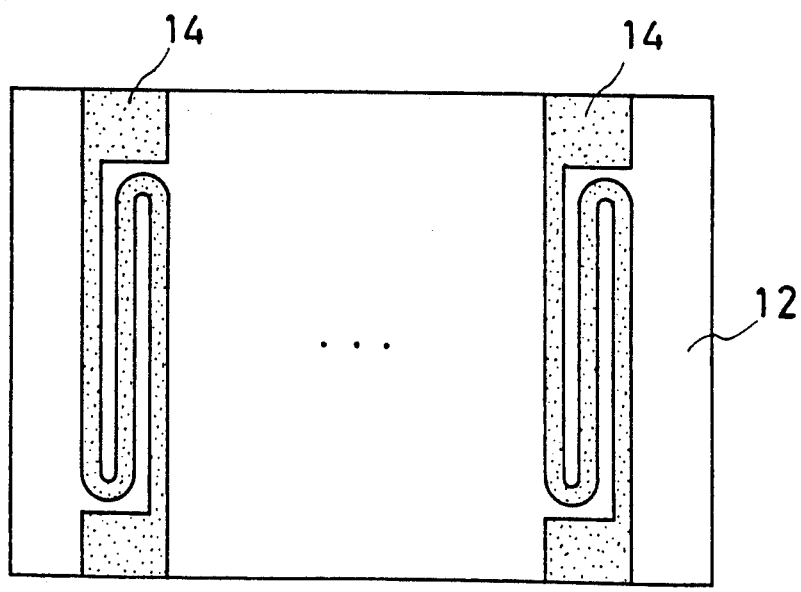
FIG. 9 is an illustrative view showing a modified example of individual electrodes in FIG. 7 embodiment.

In order to obtain the above described inductance L, the individual electrode 14 may be formed as shown in FIG. 9. More specifically, in the FIG. 7 embodiment, the individual electrode 14 is folded in a direction of the length of the dielectric unit 12 so as to be in a zigzag fashion, but in FIG. 9, the individual electrode 14 is folded in a direction of the width of the dielectric unit 12. In FIG. 9, the whole length of the individual electrode 14 is longer than the whole length of the dielectric unit 12 in a direction of the width thereof, and therefore, an inductance having a larger value can be formed in comparison with the case of the individual electrode 14 formed in a linear line.

Figure 10A:
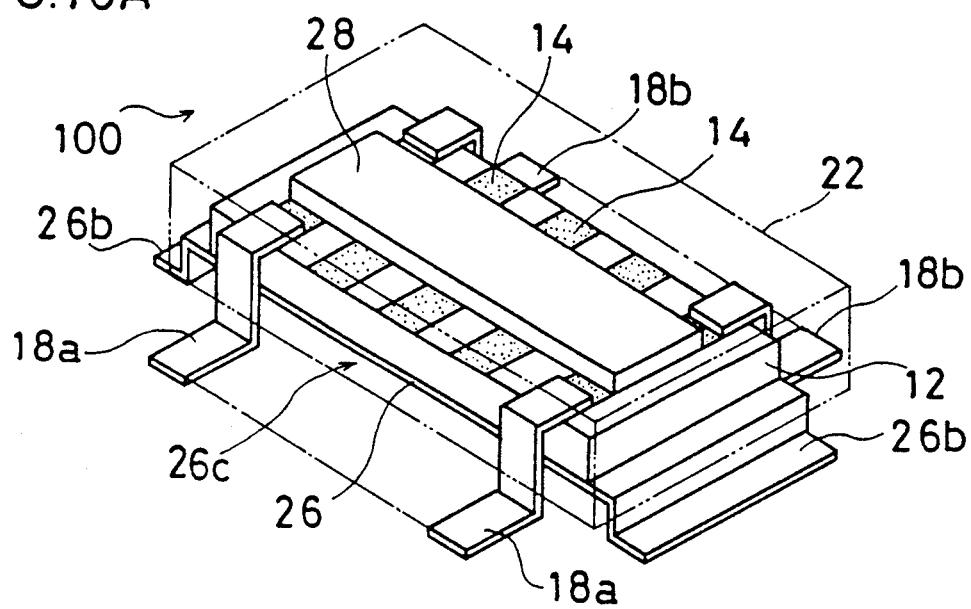
FIG. 10A and FIG. 10B are illustrative views showing a further embodiment in accordance with the present invention.
Figure 10B:
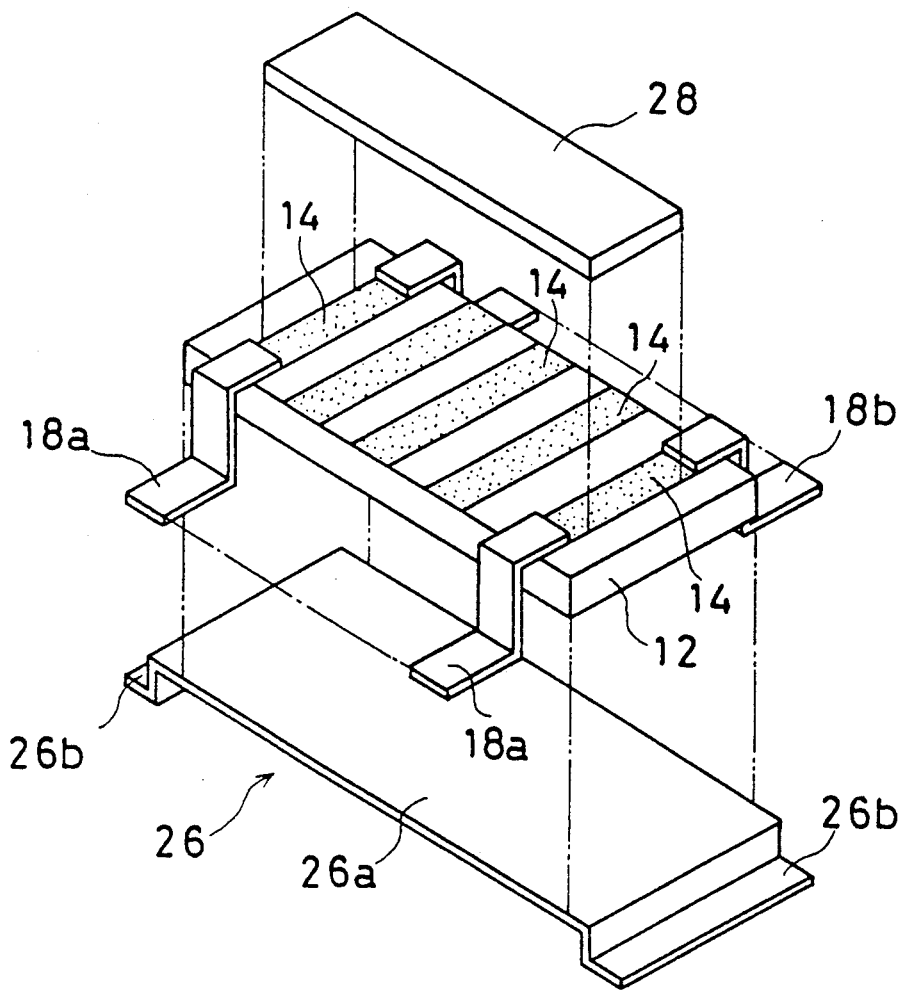

FIG. 10A and FIG. 10B show a further embodiment in accordance with the present invention, and in a filter array 100 of this embodiment, an inductance is also added to the filter array 10 as shown in FIG. 3A and FIG. 3B, and therefore, the filter array 100 has an equivalent circuit as shown in FIG. 8. More specifically, in this embodiment, a magnetic plate 28 made of such as ferrite is attached over the plurality of individual electrodes 14 formed on one main surface of the dielectric unit 12. The magnetic plate 28 constructs a magnetic circuit for respective individual electrodes 14, and therefore, the inductance L as shown in FIG. 8 is formed by respective one of the individual electrodes 14.

Figure 11A:
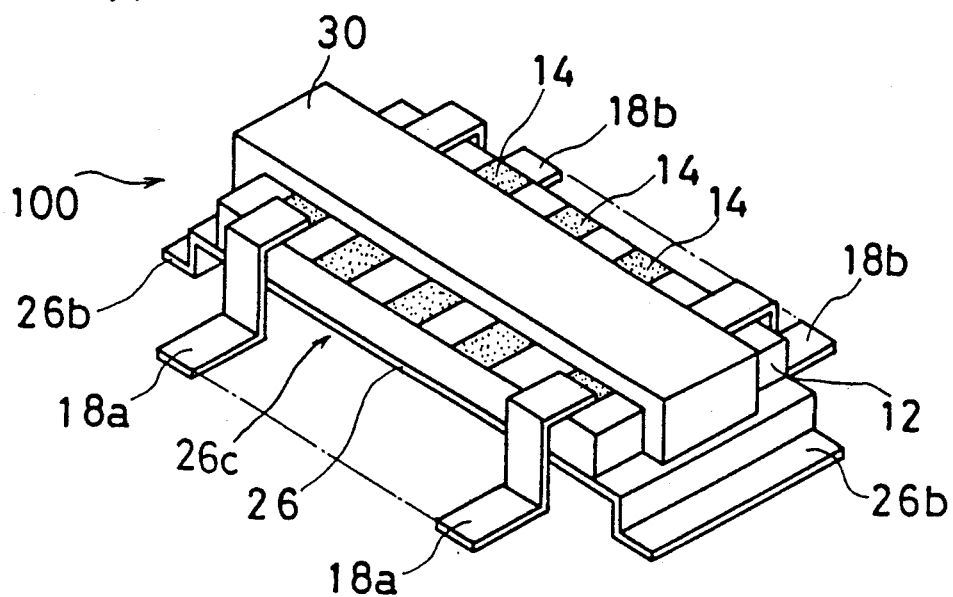
FIG. 11A and FIG. 11B are illustrative views showing a still another embodiment in accordance with the present invention.
Figure 11B:
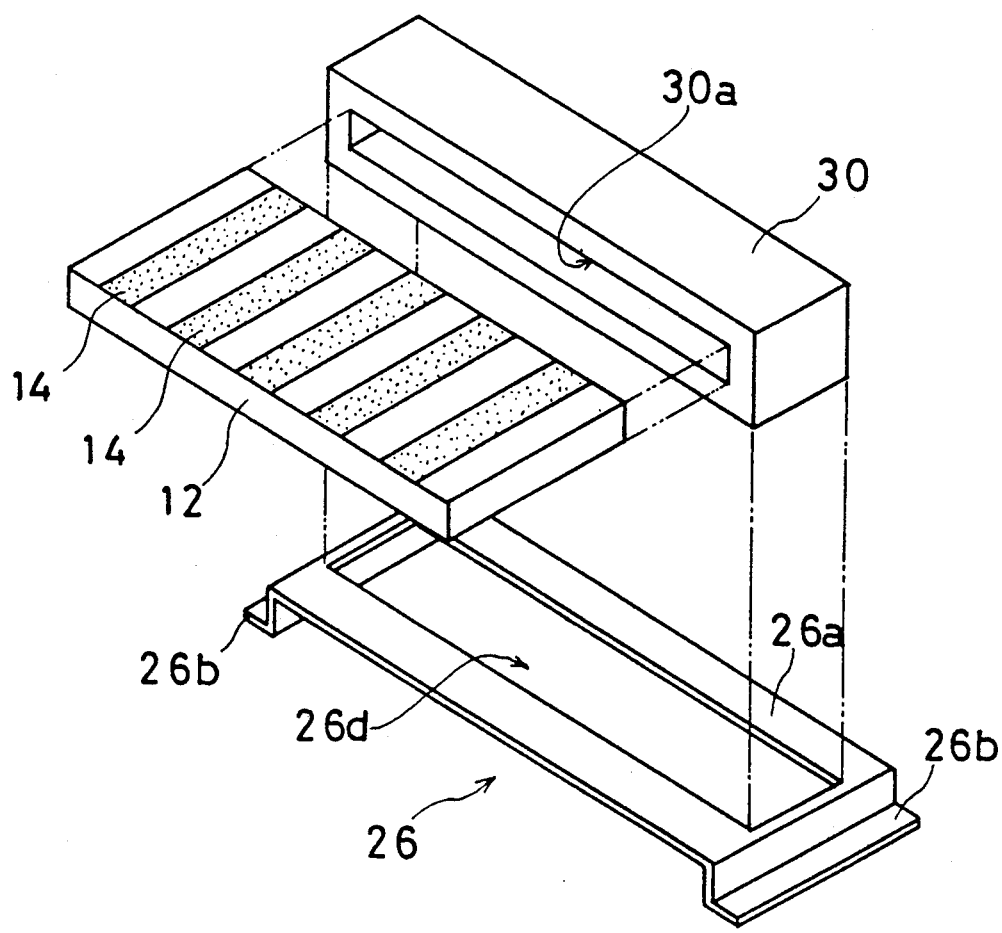

With reference to FIG. 11A and FIG. 11B, a filter array 100 of this embodiment includes a magnetic unit 30 which surrounds the dielectric unit 12. More specifically, the magnetic unit 30 includes an opening 30a an inner length of which is the same length as the dielectric unit 12, and the dielectric unit 12 is inserted into the opening 30a as shown in FIG. 11B. Therefore, the dielectric unit 12 is surrounded by the magnetic unit 30.

In addition, in this embodiment shown, an opening 26d is formed on the bottom plate 26a of the conductive plate 26, and the magnetic unit 30 is fitted into the opening 26d.

Since the magnetic unit 30 functions as a choke coil in the common mode, the filter array 100 as shown in FIG. 11A and FIG. 11B is constructed as a noise filter which is especially effective in the common mode.

Figure 12:
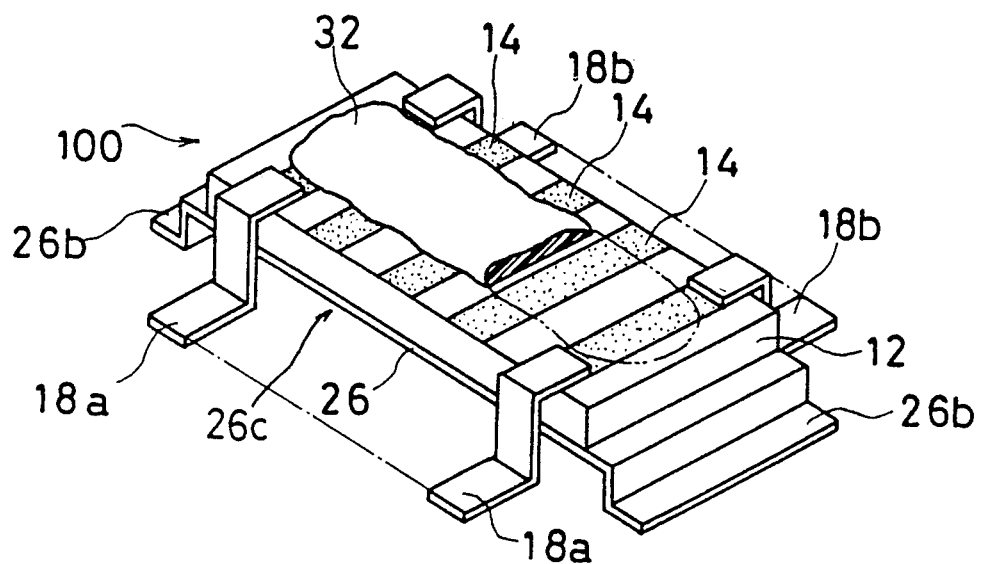
FIG. 12 is a perspective view showing a still further embodiment in accordance with the present invention.

With reference to FIG. 12, in this embodiment shown, a magnetic resin 32 is adhered onto the individual electrodes 14. As such a magnetic resin 32, an epoxy resin in which ferrite powder is mixed can be utilized. In FIG. 12 embodiment, the same advantage as that of the embodiment shown in FIG. 10A and FIG. 10B can be performed.

Figure 13:
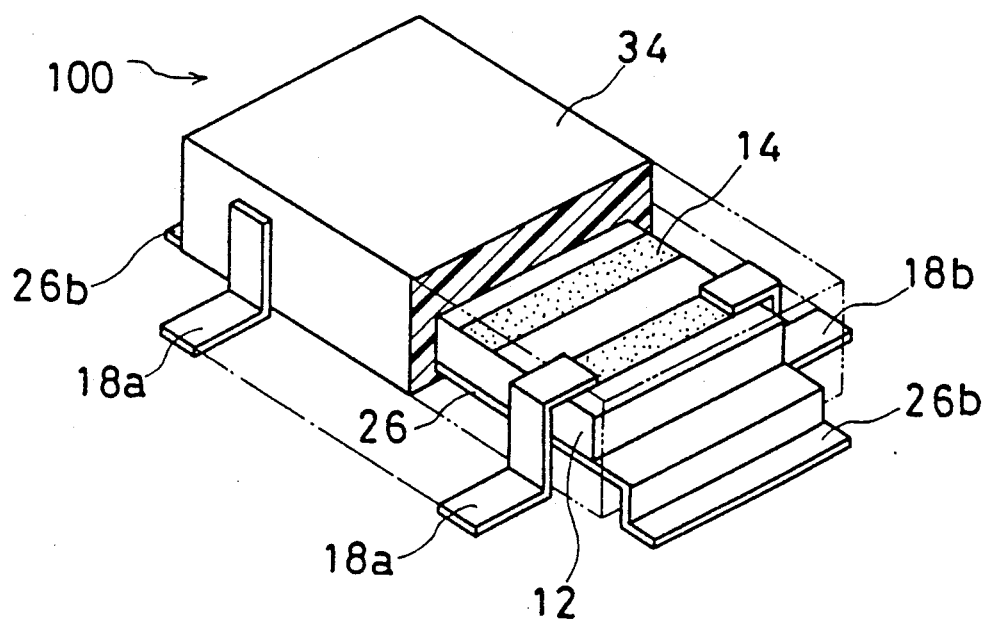
FIG. 13 is a perspective view showing the other example in accordance with the present invention.

FIG. 13 shows the other embodiment in accordance with the present invention, a filter array 100 of this embodiment includes a molded layer 34 which is made of a magnetic resin and entirely surrounds the components. Therefore, in FIG. 13 embodiment, the above described advantage can be obtain equally. As a magnetic resin for the molded layer 34, an epoxy resin into which ferrite powder is mixed can be utilized.

In addition, in the embodiments shown in FIG. 10 through FIG. 13, in order to obtain the inductance L having larger value, longer individual electrode 14 may be formed as shown in FIG. 7 or FIG. 9.

Furthermore, a conductive plate having a step as shown in FIG. 5 is utilized in each embodiment as shown in FIG. 7 and thereafter, but in these embodiments, similar to the embodiment as shown in FIG. 3A and FIG. 3B, a plain conductive plate may be utilized.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A filter array having a plurality of capacitance elements, comprising:

a dielectric unit having first and second main surfaces which define first and second orthogonal dimensions, said dielectric unit having a pair of sides which oppose each other across said first dimension and a pair of ends which oppose each other across said second dimension;

a plurality of individual electrodes formed on said first main surface of said dielectric unit at predetermined intervals;

a common electrode formed on said second main surface of said dielectric unit so as to be opposite to said plurality of individual electrodes, said plurality of capacitance elements being formed by said dielectric unit, said common electrode and respective ones of said plurality of individual electrodes;

a plurality of pairs of input and output terminals, each pair of which are connected to two ends of a respective one of said individual electrodes, said plurality of pairs of input and output terminals extending from said dielectric unit in a direction parallel with said main surfaces of said dielectric unit;

a common terminal connected to said common electrode, said common terminal being formed by a conductive plate, and said conductive plate including a connecting surface which is connected to a surface of said common electrode formed on said second main surface of said dielectric unit, and said conductive plate being bent at positions corresponding to said ends of said dielectric unit so that an airgap is formed below said connecting surface of said conductive plate;

wherein said plurality of individual electrodes are formed so as to extend fully across said first main surface from one side to the other side of said dielectric unit, each of said plurality of pairs of input and output terminals being connected to a corresponding one of said individual electrodes at said one side and said other side of said dielectric unit; and wherein each of said individual electrodes is longer than a distance from said one side to said other side of said dielectric unit.

2. A filter array in accordance with claim 1, wherein said common terminal extends away from said main surface of said conductive plate in a different direction than said input and output terminals.

3. A filter array in accordance with claim 1, wherein said input and output terminals and said common terminal are disposed at the same height position relative to a height dimension orthogonal to both said first and second dimensions.

4. A filter array in accordance with claim 1, wherein said common terminal is extended from said conductive plate in the same direction as said input and output terminals.

5. A filter array in accordance with claim 1, wherein said individual electrodes are formed in a snaked or zigzag fashion.

6. A filter array in accordance with claim 1, wherein said common terminal extends away from said dielectric unit in the same direction as said input and output terminals.

7. A filter array in accordance with claim 6, wherein said input and output terminals and said common terminal are disposed at the same height position relative to a height dimension orthogonal to both said first and second dimensions.

8. A filter array having a plurality of capacitance elements, comprising:
a dielectric unit having first and second main surfaces which define first and second orthogonal dimensions, said dielectric unit having a pair of sides which oppose each other across said first dimension and a pair of ends which oppose each other across said second dimension;
a plurality of individual electrodes formed on said first main surface of said dielectric unit at predetermined intervals;
a common electrode formed on said second main surface of said dielectric unit so as to be opposite to said plurality of individual electrodes, said plurality of capacitance elements being formed by said dielectric unit, said common electrode and respective ones of said plurality of individual electrodes;
a plurality of pairs of input and output terminals, each pair of which are connected to two ends of a respective one of said individual electrodes, said plurality of pairs of input and output terminals extending from said dielectric unit in a direction parallel with said main surfaces of said dielectric unit;
a common terminal connected to said common electrode, said common terminal being formed by a conductive plate, and said conductive plate including a connecting surface which is connected to a surface of said common electrode formed on said second main surface of said dielectric unit, and said conductive plate being bent at positions corresponding to said ends of said dielectric unit so that an airgap is formed below said connecting surface of said conductive plate; further comprising a magnetic body disposed in the vicinity of said individual electrodes.

9. A filter array in accordance with claim 8, wherein said magnetic body is applied on said individual electrodes.

10. A filter array in accordance with claim 8, wherein said magnetic body surrounds said dielectric unit.

11. A filter array in accordance with claim 8, wherein said common terminal is extended from said conductive plate in the same direction as said input and output terminals.

12. A filter array in accordance with claim 8, wherein said common terminal extends away from said main surface of said conductive plate in a different direction than said input and output terminals.

13. A filter array in accordance with claim 8, wherein said input and output terminals and said common terminal are disposed at the same height position relative to a height dimension orthogonal to both said first and second dimensions.

14. A filter array in accordance with claim 8, wherein said common terminal extends away from said dielectric unit in the same direction as said input and output terminals.

15. A filter array in accordance with claim 14, wherein said input and output terminals and said common terminal are disposed at the same height position relative to a height dimension orthogonal to both said first and second dimensions.

16. A filter array which includes a plurality of capacitance elements, comprising:
a dielectric unit having a rectangular shape which defines a length direction and a width direction, having two opposite ends which oppose each other across aid length direction and two opposite sides which oppose each other across said width direction;
a plurality of individual electrodes, each having two ends, one end being at each of said sides of the dielectric unit, formed on one main surface of said dielectric unit and forming respective current paths extending fully across said main surface between said two opposite sides, said individual electrodes being spaced apart at predetermined intervals with respect to said length direction, and extending generally in said direction of width of said dielectric unit, at least one of said plurality of individual electrodes being folded to form at least two successive portions of said at least one electrode, both portions extend in the direction of the width of said dielectric unit but said current path runs in opposite directions in said portions, toward said opposite sides of said dielectric unit, so as to define a meandering pattern;
a common electrode formed on another main surface of said dielectric unit so as to be opposite to said plurality of individual electrodes, said plurality of capacitance elements being formed by said dielectric unit, said common electrode, and respective ones of said plurality of individual electrodes;

a plurality of pairs of input and output terminals, each pair being connected to the two ends of a respective one of said individual electrodes;

wherein said plurality of individual electrodes are formed so as to extend fully across said first main surface from one side to the other side of said dielectric unit, each of said plurality of pairs of input and output terminals being connected to a corresponding one of said individual electrodes at said one side and said other side of said dielectric unit;

wherein each of said individual electrodes is longer than a distance from said one side to said other side of said dielectric unit; and a common terminal connected to said common electrode.

17. A filter array according to claim 16, wherein at least an adjacent pair of said plurality of individual electrodes are so folded.

18. A filter array according to claim 17, wherein all of said plurality of individual electrodes are so folded.

19. A filter array which includes a plurality of capacitance elements, comprising:

a dielectric unit having a rectangular shape which defines a length direction and a width direction;

a plurality of individual electrodes formed on one main surface of said dielectric unit at predetermined intervals and extending fully across aid dielectric unit in said direction of width of said dielectric unit and terminating in respective ends, at least one of said plurality of individual electrodes forming a meandering pattern having at least two successive portions of said at least one electrode, both portions extending generally in said width direction, but being spaced from one another in said length direction, thereby providing generally opposite current path directions for a current in said electrode, wherein each of said individual electrodes is longer than a distance fully across aid dielectric unit in said direction of width;

a common electrode formed on another main surface of said dielectric unit so as to be opposite to said plurality of individual electrodes, said plurality of capacitance elements being formed by said dielectric unit, said common electrode, and respective ones of said plurality of individual electrodes;

a plurality of pairs of input and output terminals, each pair being connected to said respective ends of a respective one of said individual electrodes; and a common terminal connected to said common electrode.

20. A filter array according to claim 19, wherein at least an adjacent pair of said individual electrodes form such a meandering pattern.

21. A filter array according to claim 20, wherein all of said individual electrodes form such a meandering pattern.

* * * * *